United States Patent
Lee

(10) Patent No.: US 8,085,614 B2
(45) Date of Patent: Dec. 27, 2011

(54) SOURCE CONTROL CIRCUIT AND SEMICONDUCTOR MEMORY DEVICE USING THE SAME

(75) Inventor: Jong Won Lee, Gwangmyeong-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 250 days.

(21) Appl. No.: 12/455,784

(22) Filed: Jun. 4, 2009

(65) Prior Publication Data

US 2010/0142305 A1 Jun. 10, 2010

(30) Foreign Application Priority Data

Dec. 5, 2008 (KR) .................. 10-2008-0123554

(51) Int. Cl.
*G11C 5/14* (2006.01)
(52) U.S. Cl. .......................................... 365/229
(58) Field of Classification Search .................. 365/226, 365/229
See application file for complete search history.

(56) References Cited

U.S. PATENT DOCUMENTS

| 5,321,654 | A | 6/1994 | Miyamoto et al. | |
|---|---|---|---|---|
| 6,657,911 | B2 | 12/2003 | Yamaoka et al. | |
| 2004/0042325 | A1* | 3/2004 | Ashizawa | 365/232 |
| 2005/0094474 | A1* | 5/2005 | Deng et al. | 365/229 |
| 2006/0250179 | A1* | 11/2006 | Lee | 327/541 |

FOREIGN PATENT DOCUMENTS

| JP | 2008-153576 | 7/2008 |
|---|---|---|
| KR | 10-1998-0012456 | 4/1998 |

* cited by examiner

*Primary Examiner* — Huan Hoang
*Assistant Examiner* — Jay Radke
(74) *Attorney, Agent, or Firm* — John P. White; Cooper & Dunham LLP

(57) ABSTRACT

A source control circuit comprises a control signal generating unit for generating a standby signal which is enabled in a standby condition, and a switching unit connected between a power line for supplying power to an internal circuit and an external power and controlling the supply of the external power in response to the standby signal.

22 Claims, 7 Drawing Sheets

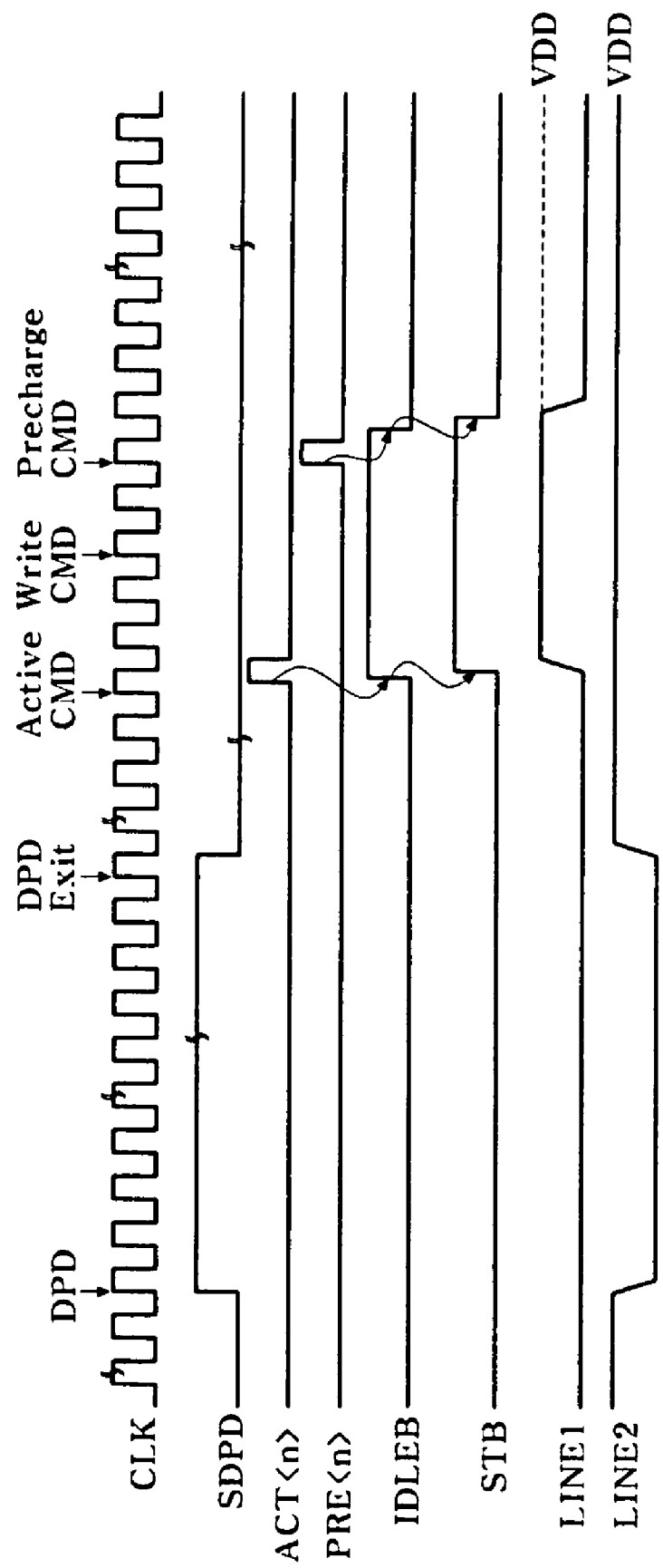

SOURCE CONTROL CIRCUIT AND SEMICONDUCTOR MEMORY DEVICE USING THE SAME

TECHNICAL FIELD

The present invention relates to a semiconductor memory device, and more particularly, to a source control circuit capable of reducing leakage current generated in a standby condition and a semiconductor memory device using the same.

BACKGROUND

With development of technology, semiconductor devices continuously advance toward high integration and high speed and are used in a variety of products from large home appliances to small mobile products.

FIG. 1 is a block diagram showing a structure of a circuit for cutting off supply of external power in a conventional semiconductor memory device.

The conventional semiconductor memory device includes, as shown in FIG. 1, an internal circuit 1 connected to be driven between an external power VDD and a ground power and a PMOS transistor P1 which controls the supply of the external power VDD in response to a deep power down mode signal SDPD.

The internal circuit 1 includes every circuit inside the semiconductor memory device such as an input buffer, a command decoder, a word line signal generating circuit, a cell block and a data pad.

The PMOS transistor P1 is provided between the external power VDD and the internal circuit 1 and cut off the supply of the external power VDD to reduce the leakage current generated in the internal circuit 1 in the deep power down mode. That is to say, when the internal circuit is entered into the deep power down mode, the deep power down mode signal becomes a high level and the PMOS transistor P1 is turned off to cut off the supply of the external power.

However, besides the leakage current generated in the deep power down mode, leakage current generated in a standby condition is also an issue. Particularly, as a transistor with low threshold voltage is used in order to raise an operation speed of the semiconductor memory device, a response speed is improved, whereas the leakage current in the standby condition is more increased.

SUMMARY

In an aspect of this disclosure, there is provided a source control circuit, which cuts off source supply to an internal circuit inside a semiconductor memory device and thus can raise a response speed by employing a switching device with low threshold voltage in circuits controlling column paths as well as reduce generation of leakage current according thereto.

In an exemplary embodiment, a source control circuit comprises a control signal generating unit for generating a standby signal which is enabled in a standby condition, and a switching unit connected between a power line for supplying power to an internal circuit and a terminal of an external power and controlling the supply of the external power in response to the standby signal.

BRIEF DESCRIPTION OF THE DRAWINGS

The above and other aspects, features and other advantages will be more clearly understood from the following detailed description taken in conjunction with the accompanying drawings, in which:

FIG. 10 is a waveform illustrating signals for explaining an the operation of the circuit of FIG. 6, when the semiconductor memory device is entered into a standby condition after performing a writing operation.

DESCRIPTION OF EXEMPLARY EMBODIMENTS

Hereinafter, exemplary embodiments of the present invention will be described with reference to accompanying drawings. However, the embodiments are for illustrative purposes only and are not intend to limit the scope of the invention.

Figure 1:
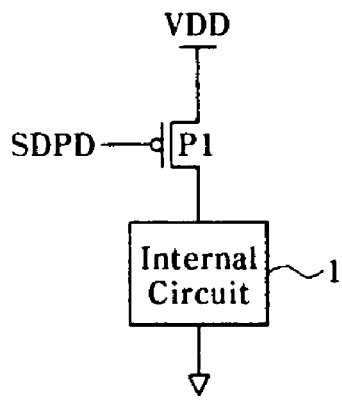
FIG. 1 is a block diagram showing a circuit for cutting off supply of external power in a conventional semiconductor memory device.
Figure 2:
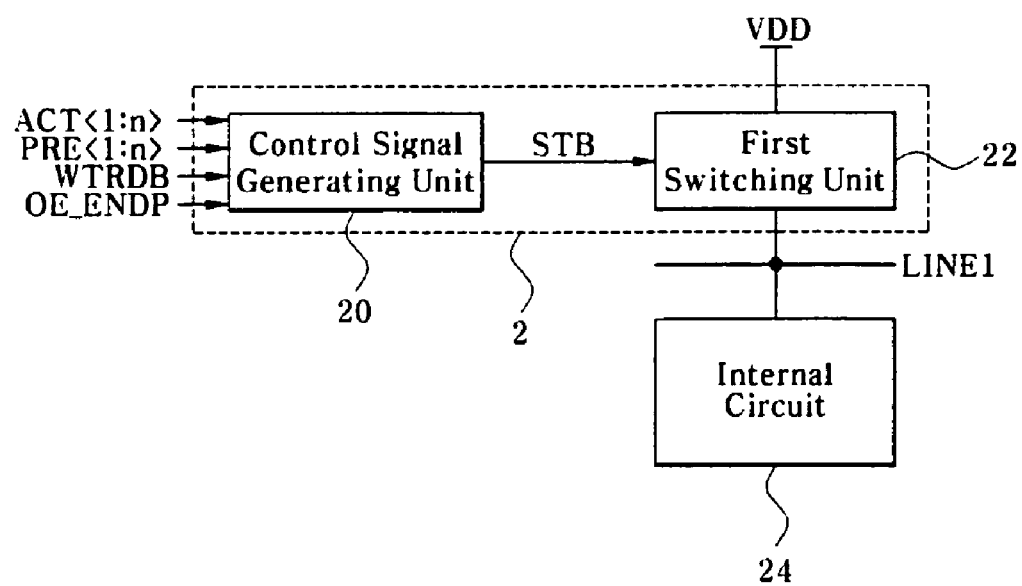
FIG. 2 is a block diagram illustrating the structure of a semiconductor memory device including a source control circuit, according to a first embodiment of the present invention.

FIG. 2 is a block diagram illustrating the structure of a semiconductor memory device including a source control circuit, according to a first embodiment of the present invention.

A semiconductor memory device according to a first embodiment of the present invention comprises, as shown in FIG. 2, a first source control circuit 2 having a control signal generating unit 20 and a first switching unit 22, and an internal circuit 24.

Figure 3:
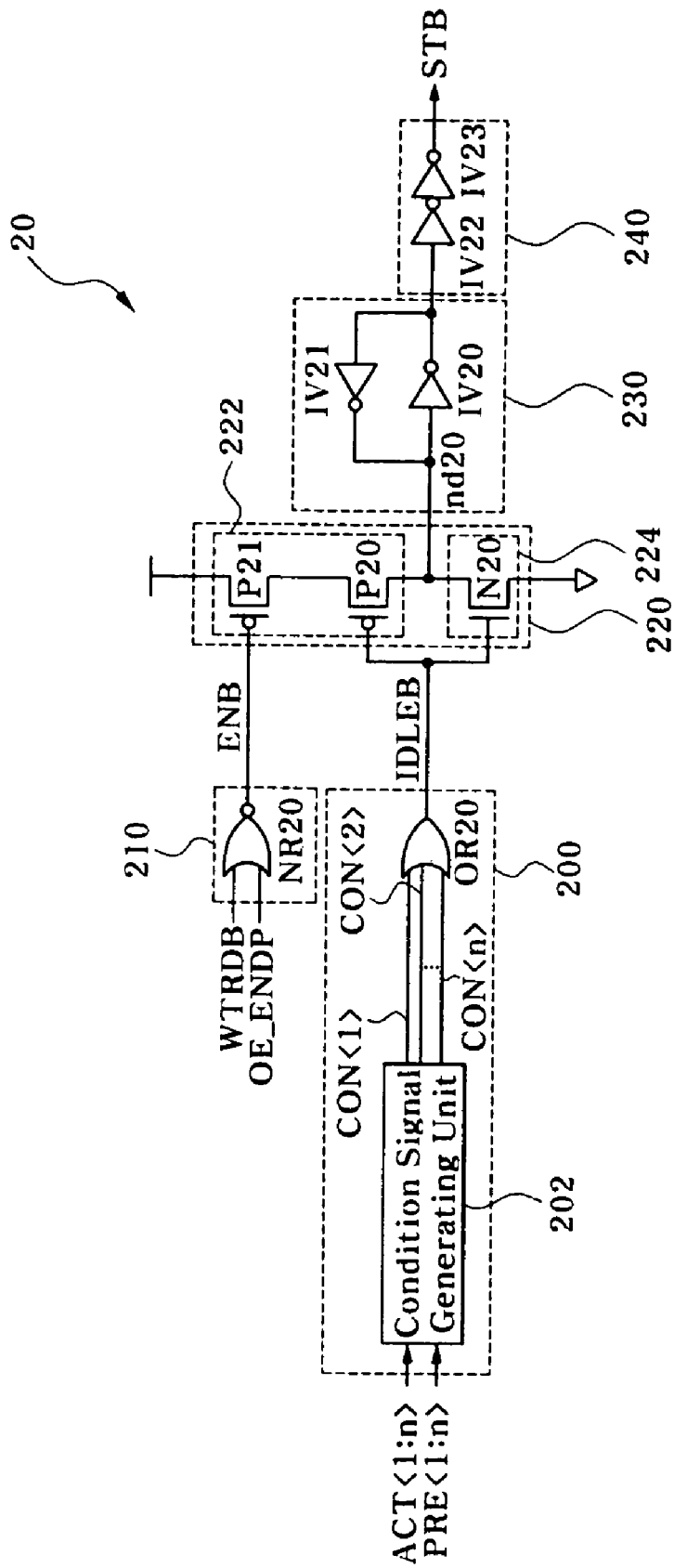
FIG. 3 is a diagram illustrating a circuit for generating a control signal shown in FIG. 2.

The control signal generating unit 20 comprises, as shown in FIG. 3, an idle signal generating unit 200, an enable signal generating unit 210, a first driving unit 220, a first latch unit 230 and a buffer unit 240.

The idle signal generating unit 200 receives active signals ACT<1:n> and precharge signals PRE<1:n>, and generates an idle signal IDLEB, and comprises a condition signal generating unit 202 and an OR gate OR20.

Figure 4:
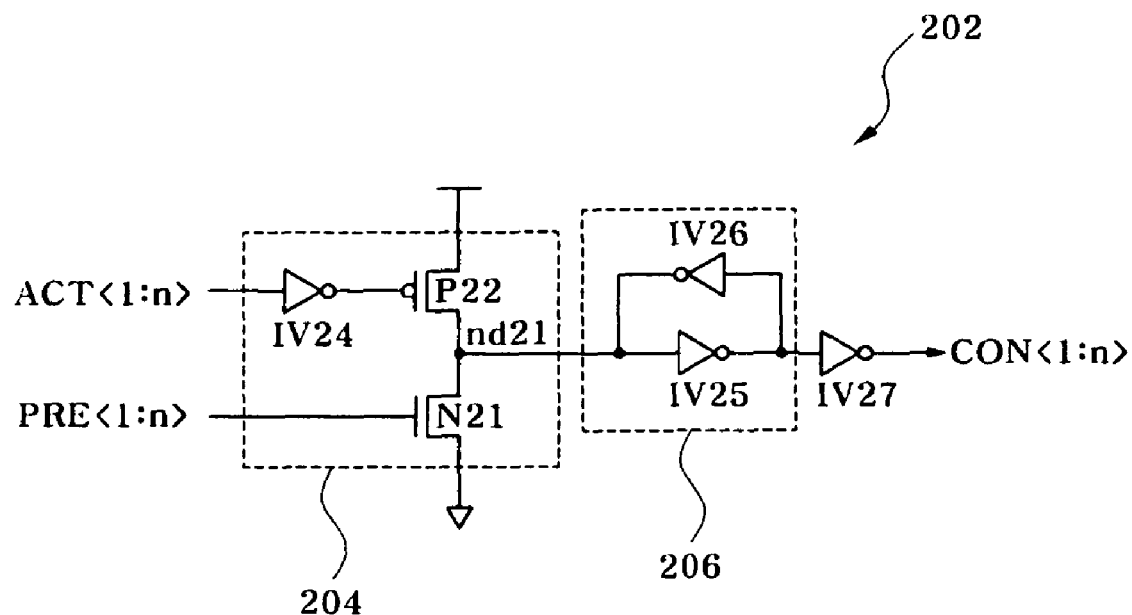
FIG. 4 is a diagram illustrating a circuit for generating a condition signal shown in FIG. 2.

The condition signal generating unit 202 comprises, as shown in FIG. 4, a second driving unit 204 which drives a node nd21 in response to the active signals ACT<1:n> and the precharge signals PRE<1:n>, a second latch unit 206 which latches a signal of the node nd21, and an inverter IV27 which inverts a signal outputted from the second latch unit 206 to generate condition signals CON<1:n>. The active signals ACT<1:n> are enabled to a high level when the corresponding bank is entered into an active condition, respectively, and the precharge signals PRE<1:n> are enabled to a high level when the corresponding bank is precharged, respectively. For example, when an $n^{th}$ bank is in an active condition, the $n^{th}$ active signal ACT<n> is at a high level and the $n^{th}$ precharge signal PRE<n> becomes a low level. Therefore, the $n^{th}$ condition signal CON<n> becomes a high level. On the contrary, when the $n^{th}$ bank is precharged, the $n^{th}$ active signal ACT<n> is at a low level and the $n^{th}$ precharge signal PRE<n> becomes a high level. Therefore, the $n^{th}$ condition signal CON<n> becomes a low level.

The idle signal IDLEB generated by the idle signal generating unit 200 configured as described above is disabled to a high level when at least one bank is entered into an active condition, and the idle signal IDLEB is enabled to a low level when all banks are precharged.

The enable signal generating unit 210 comprises a NOR gate NR20 which performs a NOR operation with respect to a read/write signal WTRDB and an output end signal OE_ENDP and generates an enable signal ENB. The read/write signal WTRDB is a level signal which becomes a high level upon a writing operation and becomes a low level upon a reading operation at an ending of a writing operation. In addition, the output end signal OE_ENDP is enabled when all data has been outputted to a data pad and the reading operation has ended. Therefore, the enable signal ENB is enabled to a low level when the read/write signal WTRDB becomes a high level at an ending of the writing operation or the output end signal OE_ENDP is enabled to a high level at an ending of the reading operation.

The first driving unit 220 comprises a pull-up driving unit 222 which pulls up a node nd20 in response to the idle signal IDLEB and the enable signal ENB, and a pull-down driving unit 224 which pulls down the node nd20 in response to the idle signal IDLEB.

The pull-up driving unit 222 comprises a PMOS transistor P20 which is turned on in response to the idle signal IDLEB and a PMOS transistor P21 which is turned on in response to the enable signal ENB.

The pull-down driving unit 224 comprises a NMOS transistor N20 which is turned on in response to the idle signal IDLEB.

The pull-up driving unit 222 pulls up the node nd20 when the idle signal IDLEB is enabled to a low level to turn on the PMOS transistor P20 and the enable signal ENB is enabled to a low level to turn on the PMOS transistor P21. More specifically, upon the writing operation, the node nd20 is pulled up only when the read/write signal WTRDB becomes a high level and all the banks perform the precharge operation by inputting an external precharge command after a write recovery time tWR, wherein tWR ensures that the external data has been sufficiently stored after beginning the writing operation thus ending the writing operation. Meanwhile, upon the reading operation, the node nd20 is pulled up only when all the banks perform the precharge operation and the output end signal becomes a high level by an ending of the reading operation. That is to say, when the reading operation or the writing operation ends, the enable signal ENB and the idle signal IDLEB are at a low level and the node nd20 is pulled up.

Meanwhile, the pull-down driving unit 224 pulls down the node nd20 through the NMOS transistor N20 which is turned on in response to the idle signal IDLEB of a high level when at least one bank is entered into an active condition. That is to say, when the semiconductor memory device is entered into an active condition, the idle signal IDLEB becomes a high level and the node nd20 is pulled down.

The first latch unit 230 latches the signal of the node nd20 and the buffer unit 240 buffers the output signal of the first latch unit 230 to generate a standby signal STB.

The control signal generating unit 20 configured as described above pulls down the node nd20 by the idle signal IDLEB at a high level to generate the standby signal STB which is disabled to a high level when the semiconductor memory device is entered into an active condition. Also, the control signal generating unit 20 pulls up the node nd20 by the idle signal IDLEB at a low level and the enable signal ENB at a low level to generate the standby signal STB which is enabled to a low level when the reading operation or the writing operation ends. That is to say, the control signal generating unit 20 generates the standby signal STB disabled to a high level in the reading operation period or the writing operation period, and generates the standby signal STB enabled to a low level when the reading operation period or the writing operation period is ended and the semiconductor memory device is entered into a standby condition.

Figure 5:
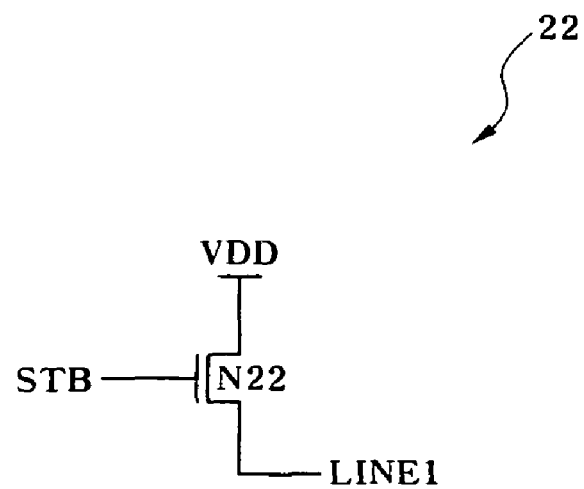
FIG. 5 is a diagram illustrating a first switching unit in the source control circuit shown in FIG. 2.

The first switching unit 22 comprises, as shown in FIG. 5, a NMOS transistor N22 which is connected between a terminal of the external power VDD and a first power line LINE1 and controls the supply of the external power VDD to the first power line LINE1 in response to the standby signal STB. That is to say, the first switching unit 22 supplies the external power VDD to the internal circuit 24 through the first power line LINE1 in the active condition, but cuts off the supply of the external power VDD to the internal circuit 24 through the first power line LINE1 in the standby condition.

The internal circuit 24 may comprises various circuits used to control row paths and column paths, for example, an output enable signal generating unit for controlling the column path of a cell block and a data control unit for exchanging data with the activated cell.

Operation of the semiconductor memory device according to the first embodiment of the present invention will be described with respect to when the semiconductor memory device is entered into the active condition and the standby condition, respectively.

Hereinafter, operation when the semiconductor memory device is entered into the active condition will be described.

When the $n^{th}$ bank is entered into an active condition, the $n^{th}$ active signal ACT<n> becomes a high level and the condition signal generating unit 202 generates the $n^{th}$ condition signal CON<n> at a high level. The OR gate OR20 receives the $n^{th}$ condition signal CON<n> at a high level and generates the idle signal IDLEB disabled to a high level, and the node nd20 of the pull-down driving unit 224 is pulled down and the standby signal STB is disabled to a high level.

Since the NMOS transistor N22 of the first switching unit 22 is turned on in response to the standby signal STB at a high level, the external power VDD is supplied to the internal circuit 24 through the first power line LINE1.

Hereinafter, operation of the semiconductor memory device will be described with respect to cases that the semiconductor memory device is entered into the standby condition after the writing operation is performed and after the reading operation is performed, respectively.

First, operation when the semiconductor memory device is entered into the standby condition after the writing operation is performed is as follows.

When at least one bank is entered into an active condition, the idle signal IDLER is disabled to a high level. At this time, if a writing operation ends, the read/write signal WTRDB becomes a high level and the enable signal ENB is enabled to a low level. Therefore, the PMOS transistor P21 of the pull-up driving unit 222 is turned on in response to the enable signal ENB at a low level and the NMOS transistor N20 of the pull-down driving unit 224 is turned on in response to the idle signal IDLEB at a high level. Consequently, the node nd20 is pulled down and the standby signal STB is disabled to a high level.

After that, since the condition signals CON<1:n> becomes low levels when all the banks are precharged, the idle signal IDLEB is enabled to a low level through the OR gate OR20. At this time, since the PMOS transistor P21 of the pull-up driving unit 222 is maintained in a turn-on condition in response to the enable signal ENB which is already enabled to a low level, the node nd20 is pulled up simultaneously with turn-on of the PMOS transistor P20 in response to the idle signal IDLEB at a low level and the standby signal STB is enabled to a low level.

The NMOS transistor N22 of the first switching unit 22 is turned off in response to the standby signal STB at a low level to cut off the external power VDD which was supplied to the internal circuit 24 through the first power line LINE1.

Here, the reason that the writing operation period ends and the semiconductor memory device is entered into the standby condition when all the banks are precharged is because there is no risk of data loss as an external precharge command is inputted after a write recovery time tWR, wherein tWR ensures that the external data has been sufficiently stored after beginning the writing operation thus he writing operation.

Next, operation when the semiconductor memory device is entered into the standby condition after the reading operation is performed is as follows.

When at least one bank is entered into an active condition, the idle signal IDLEB is disabled to a high level through the OR gate OR20. At this time, if the reading operation begins, the read/write signal WTRDB becomes a low level and the output end signal OE_ENDP also becomes a low level. Therefore, the enable signal ENB is disabled to a high level through the NOR gate NR20 And, since the NMOS transistor N20 of the pull-down driving unit 224 is turned on in response to the idle signal IDLEB at a high level, the node nd20 is pulled down and the standby signal STB is disabled to a high level. Also, the PMOS transistor P21 of the pull-up driving unit 222 is turned off in response to the enable signal ENB at a high level and the PMOS transistor P20 is turned off in response to the idle signal IDLEB at a high level.

After that, when all the banks are precharged, the condition signals CON<1:n> becomes low levels and the idle signal IDLES is enabled to a low level through the OR gate OR20. Therefore, the PMOS transistor P20 of the pull-up driving unit 222 is turned on in response to the idle signal IDLEB. On the contrary, the PMOS transistor P21 is turned off in response to the enable signal ENB at a high level since the read/write signal WTRDB and the output end signal OEENDP are respectively maintained at low levels before the reading operation ends. When all data is outputted to the data pad and the output end signal OE_ENDP becomes a high level, the enable signal ENB is enabled to a low level. And, when PMOS transistor P21 is turned on in response to the enable signal at low level, the node nd20 is pulled up through the PMOS transistor P21 and the standby signal STB is enabled to a low level.

The NMOS transistor N22 of the first switching unit 22 is turned off in response to the standby signal STB at a low level to cut off the external power VDD which was supplied to the internal circuit 24 through the first power line LINE1.

Here, the reason that the reading operation period ends not when all the banks are precharged but when the output end signal OE_ENDP is enabled to a high level is because data loss can be prevented only when the external power VDD supplied to the internal circuit 24 is cut off after all data is outputted to the data pad.

As is apparent from the above description, the semiconductor memory device according to the first embodiment of the present invention can reduce generation of leakage current since it cuts off the external power VDD supplied to the internal circuit 24 in the standby condition even though a transistor with a low threshold voltage is applied to improve the operation speed in the active condition.

Figure 6:
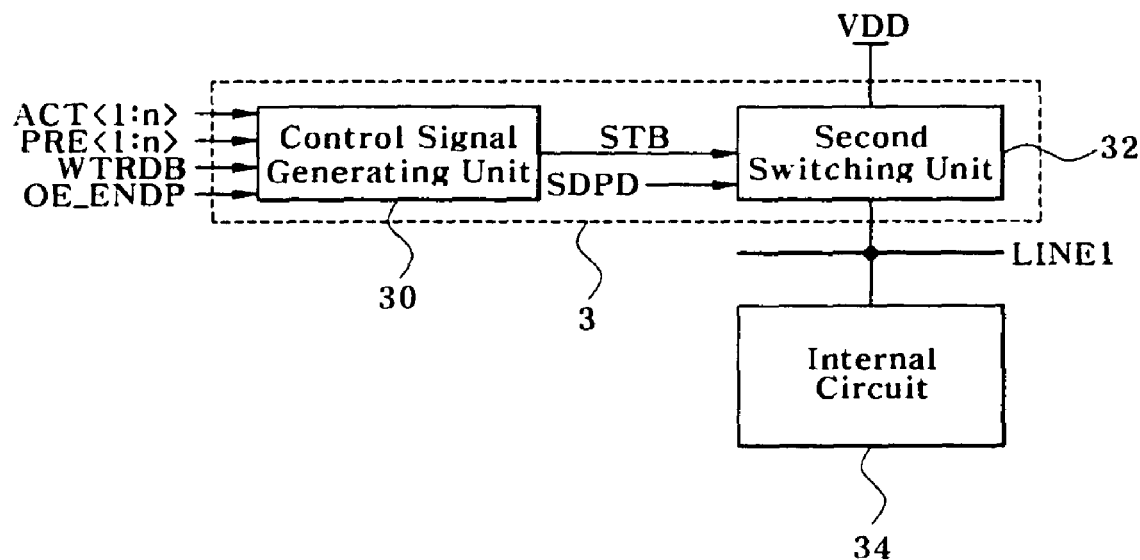
FIG. 6 is a block diagram illustrating the structure of a semiconductor memory device including a source control circuit, according to a second embodiment of the present invention.

FIG. 6 is a block diagram illustrating the structure of a semiconductor memory device according to a second embodiment of the present invention A semiconductor memory device according to the present embodiment comprises, as shown in FIG. 6, a second source control circuit 3 having a circuit 30 for generating a control signal and a second switching unit 32, and an internal circuit 34.

The configuration of the control signal generating unit 30 is the same as in the first embodiment shown in FIG. 3. That is to say, the control signal generating unit 30 generates the standby signal STB disabled to a high level when at least one bank is entered into the active condition, and generates the standby signal STB enabled to a low level after the reading operation or the writing operation ends. In other words, the standby signal STB is disabled to a high level in the reading operation period or the writing operation period.

Figure 7:
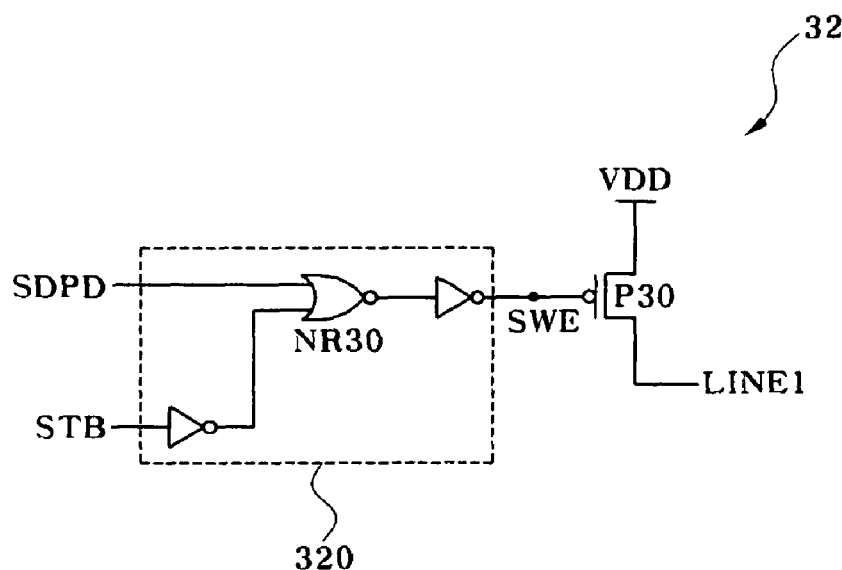
FIG. 7 is a diagram illustrating a switching unit shown in FIG. 6.

The second switching unit 32 comprises, as shown in FIG. 7, a switching enable signal generating unit 320 which receives a deep power down mode signal SDPD and the standby signal STB and generates a switching enable signal SWE, and a PMOS transistor P30 which controls supply of the external power VDD to the first power line LINE1 in response to the switching enable signal SWE. The deep power down mode signal SDPD is a signal which is enabled to a high level when the semiconductor memory device is entered into a deep power down mode. That is to say, the switching enable signal SWE is disabled to a high level when the semiconductor memory device is entered into the standby condition or the deep power down mode.

The internal circuit 34 may include various circuits used to control a column path of a cell block in the semiconductor memory device.

Figure 8:
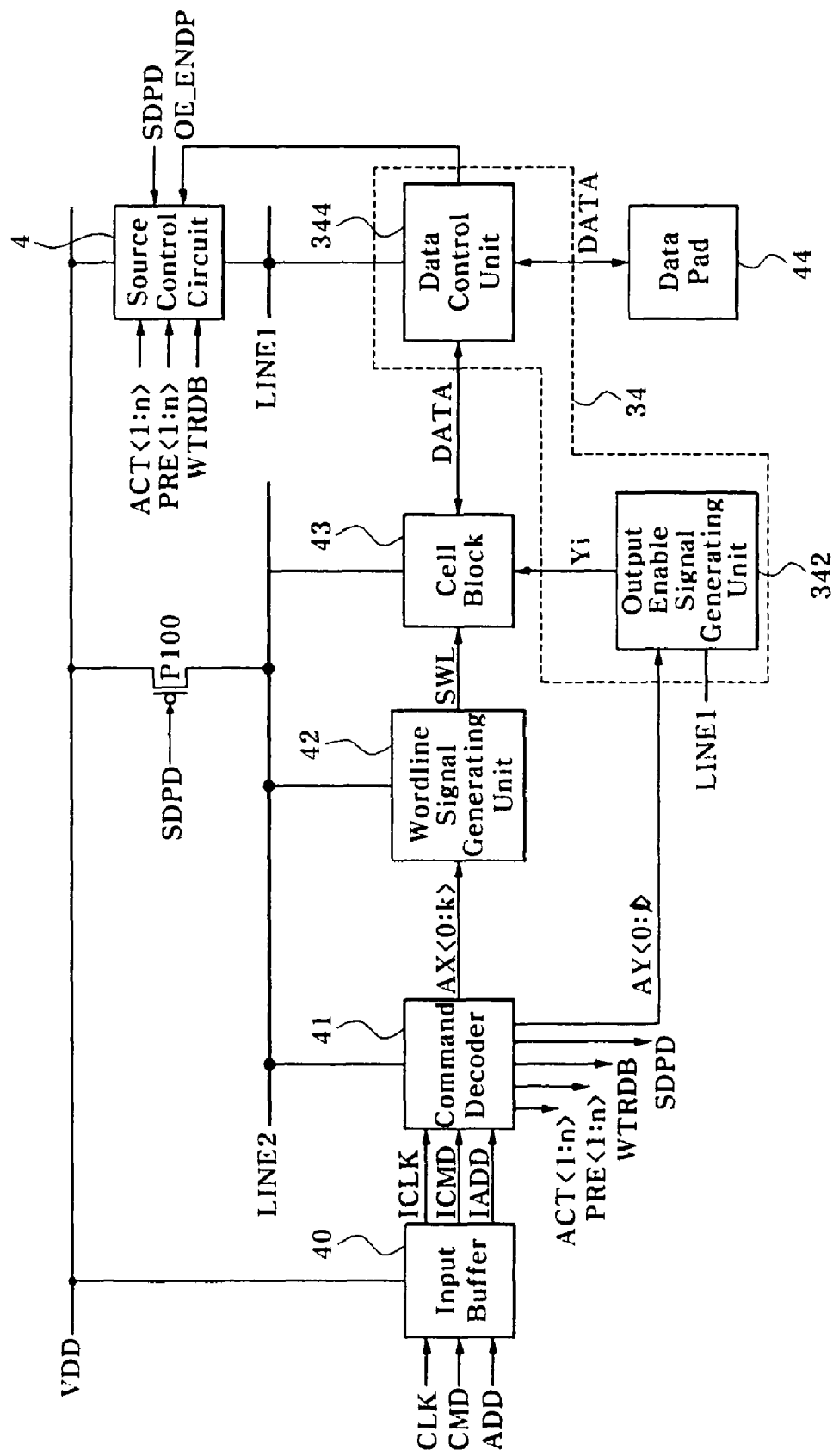
FIG. 8 is a block diagram illustrating a detailed structure of a semiconductor memory device using a source control circuit, in another exemplary view.

FIG. 8 is a block diagram illustrating a detailed structure of the semiconductor memory device using a source control circuit 4.

The semiconductor memory device according to the present embodiment includes, as shown in FIG. 8, a source control circuit 4, an internal circuit 34, a command decoder 41, a wordline signal generating unit 42, a cell block 43 and a data pad 44. The configuration of the source control circuit 4 is the same as the second source control circuit 3 in the second embodiment shown in FIG. 6.

The input buffer 40 buffers an external clock CLK, an external command CMD and an external address signal ADD inputted thereto to generate an internal clock ICLK, an internal command ICMD and an internal address signal IADD.

The command decoder 41 receives the internal clock ICLK, the internal command ICMD and the internal address signal IADD and outputs, in the active condition, row address signals AX<0:k> to the wordline signal generating unit 42 and column address signals AY<0:1> to the output enable signal generating unit 342. Also, the command decoder 41 generates the active signals ACT<1:n>, the precharge signals PRE<1:n>, the read/write signal WTRDB and the deep power down mode signal SDPD. The active signals ACT<1:n> are the signals enabled to a high level when the corresponding bank is entered into an active condition, respectively, and the precharge signals PRE<1:n> are the signals enabled to a high level when the corresponding bank is precharged, respectively. Also, the read/write signal WTRDB is a level signal which becomes a high level at an ending of the writing operation.

The wordline signal generating unit 42 selectively activates the row path of the cell block 43 by a wordline signal SWL, and the output enable signal generating unit 342 selectively activates the column path of the cell block 43 by an output enable signal Yi. Therefore, exchange of data DATA is performed between the cell activated by the wordline signal SWL and the output enable signal Yi and a data control unit 344. Data DATA in the cell is outputted to the outside through the data control unit 344 and the data pad 44 upon a reading operation, and external data DATA is stored in the cell through the data pad 44 and the data control unit 344 upon a writing operation.

Meanwhile, the output enable signal generating unit 342 and the data control unit 344 receive the power through the first power line LINE1 connected with the terminal of the external power VDD by the source control circuit 4. Also, the command decoder 41, the wordline signal generating unit 42, the output enable signal generating unit 342 and the cell block 43 receive the power through a second power line LINE2 connected with the terminal of the external power VDD by a PMOS transistor P100.

The source control circuit 4 supplies the external power VDD to the internal circuit 34 through the first power line LINE1 during the reading operation period or the writing operation period, and cuts off the external power VDD supplied to the internal circuit 34 through the first power line LINE1 after the reading operation period or the writing operation period ends, in other words, in the standby condition.

The PMOS transistor P100 is turned off in response to the deep power down mode signal SDPD which becomes a high level upon the entrance into the deep power down mode and cuts off the external power VDD supplied to the command decoder 41, the wordline signal generating unit 42, the output enable signal generating unit 342 and the cell block 43.

Figure 9:
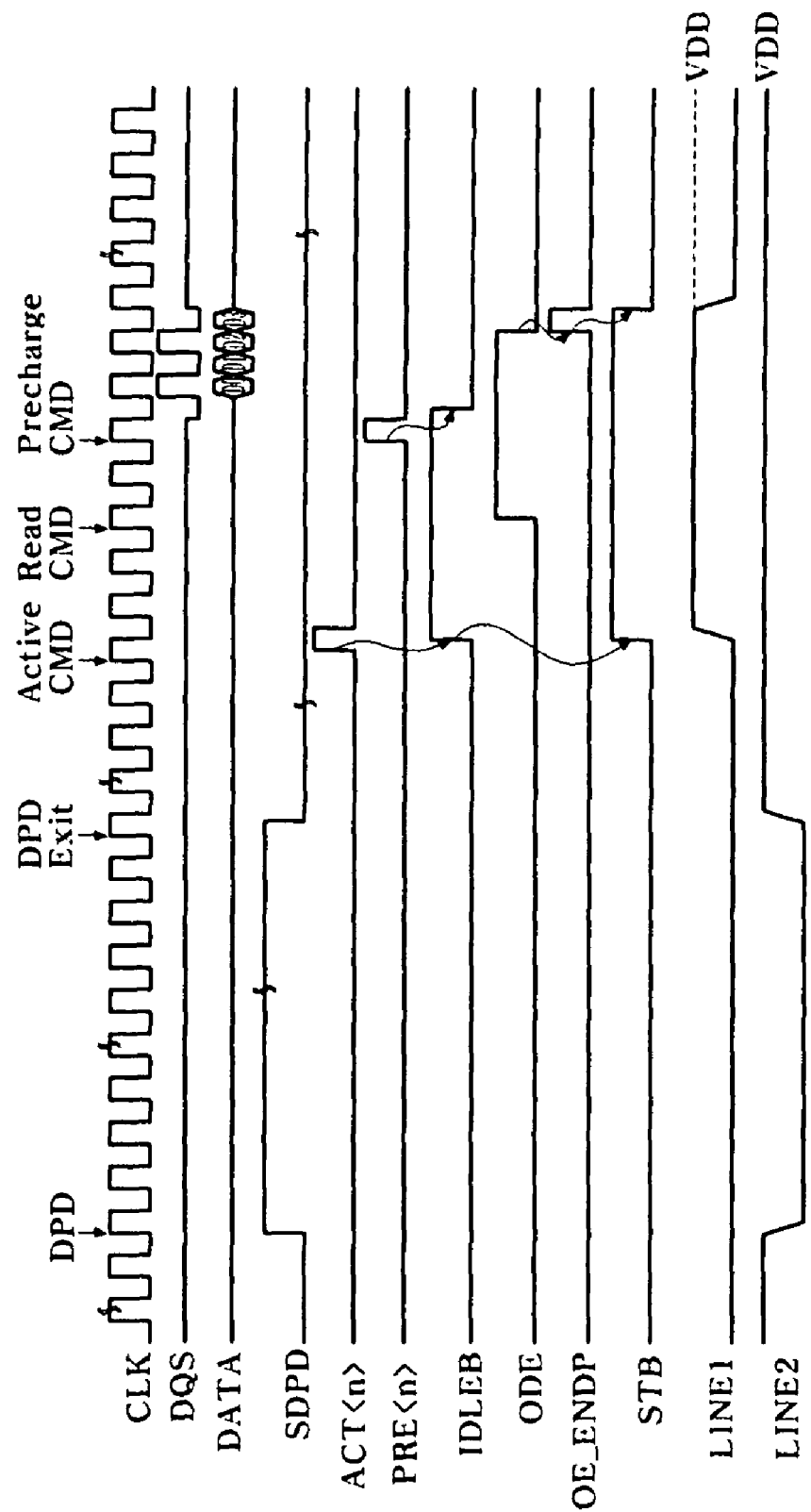
FIG. 9 is a waveform illustrating signals for explaining operation of the circuit of FIG. 6, when the semiconductor memory device is entered into a standby condition after performing a reading operation.

Operation of the semiconductor memory device of the present embodiment configured as described above will be described with reference to waveforms in FIGS. 9 and 10, with respect to when the semiconductor memory device is entered into the deep power down mode, when the semiconductor memory device is entered into the standby condition after the reading operation is performed, and when the semiconductor memory device is entered into the standby condition after the writing operation is performed, respectively.

First, with reference to FIG. 9, the case when the semiconductor memory device is entered into the deep power down mode (DPD) will be described.

In response to the deep power down mode signal SDPD which becomes a high level upon the entrance into the deep power down mode (DPD), the PMOS transistor P100 shown in FIG. 8 is turned off and the second power line LINE2 is shifted to a low level. At this time, since the source control circuit 4 enables the standby signal STB at a low level in the period other than the reading operation period and the writing operation period to cut off the connection between the first power line LINE1 and the terminal of the external power VDD, the first power line LINE1 is maintained at a low level.

After that, when the deep power down mode ends (DPD Exit), the deep power down mode signal SDPD is shifted to a low level and the PMOS transistor P100 is turned on. Therefore, the second power line LINE2 receives the external power VDD and shifted again to a high level. At this time, since the source control circuit 4 still cuts off the external power VDD until the active command Active CMD is inputted, the first power line LINE1 in maintained at a low level.

Next, the case when the semiconductor memory device is entered into the standby condition after the reading operation is performed will be described.

When the active command Active CMD is inputted and the $n^{th}$ active signal ACT<n> is enabled to a high level, the idle signal is disabled at a high level. Accordingly, the standby signal STB is disabled to a high level and the semiconductor memory device is entered into the active condition. Therefore, the source control circuit 4 supplies the external power VDD to the internal circuit 34 through the first power line LINE1.

When the read command Read CMD is inputted a driver enable signal ODE for enabling an output driver (not shown) of the data control unit 344 is enabled at a high level, and the data control unit 344 outputs data DATA read in the cell to the data pad 44 through the output driver during the enabling period of the driver enable signal ODE.

Even when the precharge command Precharge CMD is inputted and the $n^{th}$ precharge signal PRE<n> is enabled at a high level, the standby signal is maintained at a high level. After that, when the output end signal OE_ENDP is enabled at a high level in synchronization with a falling edge of the driver enable signal ODE after all data DATA is outputted to the data pad 44, the standby signal is enabled at a low level. At this time, since the semiconductor memory device is entered into the standby condition, the source control circuit 4 cuts off the external power VDD supplied to the internal circuit 34 through the first power line LINE1.

Next, the case when the semiconductor memory device is entered into the standby condition after the writing operation is performed will be described with reference to FIG. 10.

When the active command Active CMD is inputted and the $n^{th}$ active signal ACT<n> becomes a high level, the idle signal IDLEB becomes a high level. Accordingly, the standby signal STB is disabled at a high level and the semiconductor memory device is entered into the active condition. Therefore, the source control circuit 4 supplies the external power VDD to the internal circuit 34 through the first power line LINE1.

When the write command Write CMD is inputted, the data inputted from the outside is transferred to the cell through the data pad 44 and the data control unit 344 and stored in the cell.

When the precharge command Precharge CMD is inputted and the $n^{th}$ precharge signal PRE<n> is enabled at a high level after lapse of the write recovery time tWR, the idle signal IDLEB is enabled at a low level. Accordingly, the standby signal STB is enabled at a low level and the semiconductor memory device is entered into a standby condition. Therefore, the source control circuit 4 cuts off the external power VDD supplied to the internal circuit 34 through the first power line LINE1.

As is apparent from the above description, the second source control circuit 3 cuts off the supply of the external power VDD to the internal circuit 34 through the first power line LINE1 upon the entrance into the standby condition or the deep power down mode. Therefore, it is possible to reduce the generation of leakage current in the standby condition or the deep power down mode.

While the present invention has been described with respect to the specific embodiments, it will be apparent to those skilled in the art that various changes and modifications may be made without departing from the spirit and scope of the invention as defined in the following claims.

The present application claims priority to Korean application number 10-2008-0123554, filed on Dec. 5, 2008, the entire contents of which are incorporated herein by reference.

What is claimed is:

1. A source control circuit, comprising:
a control signal generating unit for generating a standby signal which is enabled in response to a read/write signal and an output end signal when all banks are recharged, wherein the read/write signal is enabled when a writing operation ends and the output end signal is enabled when all data is outputted; and
a switching unit connected between a power line for supplying power to an internal circuit and a terminal of an external power and configured to control the supply of the external power in response to the standby signal.

2. The source control circuit of claim 1, wherein the standby signal is disabled in a reading operation period or the writing operation period.

3. The source control circuit of claim 2, wherein the control signal generating unit comprises:
an idle signal generating unit for generating an idle signal which is enabled when all banks are precharged;
an enable signal generating unit for generating an enable signal which is enabled after the writing operation ends or the reading operation ends;
a driving unit for driving a node in response to the idle signal and the enable signal; and
a latch unit for latching the signal of the node to generate the standby signal.

4. The source control circuit of claim 3, wherein the control signal generating unit generates the standby signal which is disabled when at least one bank is entered into an active condition.

5. The source control circuit of claim 3, wherein the control signal generating unit generates the standby signal which is enabled when both the idle signal and the enable signal are enabled.

6. The source control circuit of claim 3, wherein the idle signal generating unit comprises:
a condition signal generating unit for generating a condition signal in response to an active signal or a precharge signal; and
a first logic device configured to receive the condition signal and generate the idle signal.

7. The source control circuit of claim 3, wherein the enable signal generating unit comprises a second logic device which receives the read/write signal and the output end signal and generates the enable signal.

8. The source control circuit of claim 1, wherein the switching unit cuts off the external power supplied to the power line when the standby signal is enabled.

9. A source control circuit, comprising:
a control signal generating unit for generating a standby signal which is enabled in response to a read/write signal and an output end signal when all banks are precharged, wherein the read/write signal is enabled when a writing operation ends and the output end signal is enabled when all data is outputted; and
a switching unit connected between a power line for supplying power to an internal circuit and a terminal of an external power and configured to control the supply of the external power in response to the standby signal and a deep power down mode signal.

10. The source control circuit of claim 9, wherein the standby signal is disabled in a reading operation period or the writing operation period.

11. The source control circuit of claim 10, wherein the control signal generating unit comprises:
an idle signal generating unit for generating an idle signal which is enabled when all banks are precharged;
an enable signal generating unit for generating an enable signal which is enabled after the writing operation ends or the reading operation ends;
a driving unit for driving a node in response to the idle signal and the enable signal; and
a latch unit for latching the signal of the node to generate the standby signal.

12. The source control circuit of claim 11, wherein the control signal generating unit generates the standby signal which is disabled when at least one bank is entered into an active condition.

13. The source control circuit of claim 11, wherein the control signal generating unit generates the standby signal which is enabled when both the idle signal and the enable signal are enabled.

14. The source control circuit of claim 11, wherein the idle signal generating unit comprises:
a condition signal generating unit for generating a condition signal in response to an active signal or a precharge signal; and
a first logic device configured to receive the condition signal and generate the idle signal.

15. The source control circuit of claim 11, wherein the enable signal generating unit comprises a second logic device which receives the read/write signal and the output end signal and generates the enable signal.

16. The source control circuit of claim 9, wherein the switching unit cuts off the external power supplied to the power line when the standby signal or the deep power down mode signal is enabled.

17. The source control circuit of claim 9, wherein the switching unit comprises:
a switching enable signal generating unit for generating a switching enable signal which is enabled when at least one of the deep power down mode signal and the standby signal is enabled; and a switching device for controlling the supply of the external power to the power line in response to the switching enable signal.

18. A semiconductor memory device, comprising:
a first internal circuit driven by external power applied through a first power line; a second internal circuit driven by the external power applied through a second power line;
a switching device connected between a terminal for receiving the external power and the first power line to control the supply of the external power upon a deep power down mode;
a control signal generating unit for generating a standby signal which is enabled in response to read/write signal and an output end signal when all banks are precharged, wherein the read/write signal is enabled when a writing operation ends and the output end signal is enabled when all data is outputted; and
a switching unit connected between the second power line for supplying power to the second internal circuit and the terminal for receiving the external power, and configured to control the supply of the external power in response to the standby signal or the deep power down mode signal.

19. The semiconductor memory device of claim 18, wherein the second internal circuit is used to control a column path of a cell block.

20. The semiconductor memory device of claim 18, wherein the standby signal is disabled in a reading operation period or the writing operation period.

21. The semiconductor memory device of claim 18, wherein the control signal generating unit comprises:
- an idle signal generating unit for generating an idle signal which is enabled when all banks are precharged;
- an enable signal generating unit for generating an enable signal which is enabled after a writing operation ends or a reading operation ends;
- a driving unit for driving a node in response to the idle signal and the enable signal; and
- a latch unit for latching the signal of the node to generate the standby signal.

22. The semiconductor memory device of claim 18, wherein the switching unit cuts off the external power supplied to the second internal circuit when the standby signal or the deep power down mode signal is enabled.

* * * * *